US006226231B1

(12) United States Patent
Kattan

(10) Patent No.: US 6,226,231 B1
(45) Date of Patent: May 1, 2001

(54) TIME INTERVAL ANALYZER HAVING MULTIPLE MEASUREMENT CIRCUITS

(75) Inventor: Shalom Kattan, Campbell, CA (US)

(73) Assignee: Guide Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/354,346

(22) Filed: Jul. 14, 1999

(51) Int. Cl.[7] .............................. G04F 8/00; G04F 10/00; H03B 3/46

(52) U.S. Cl. ........................... 368/113; 370/516; 375/371

(58) Field of Search ..................................... 368/113, 121; 370/516; 375/224, 226, 228, 371

(56) References Cited

U.S. PATENT DOCUMENTS

| | | | |
|---|---|---|---|
| 4,757,452 | 7/1988 | Scott et al. . | |
| 4,916,411 | 4/1990 | Lymer . | |
| 5,566,180 * | 10/1996 | Eidson et al. ....................... | 379/94.2 |
| 5,613,496 * | 3/1997 | Arand et al. ......................... | 728/702 |
| 5,883,924 | 3/1999 | Siu et al. . | |

OTHER PUBLICATIONS

"A High–Precision Time–to–Digital Converter for Pulsed Time–of–Flight Laser Radar Applications", pp. 521–536, Määttä and Kostamovaara, *IEEE Transactions on Instrumentation and Measurement,* vol. 47, No. 2, Apr., 1998.

"Universal Counter Resolves Picoseconds in Time Interval Measurements", pp. 2–11, and "Time Synthesizer Generates Precise Pulse Widths and Time Delays for Critical Timing Application", pp. 12–19, *Hewlett Packard Journal* Aug., 1978, Palo Alto, CA.

Hewlett–Packard Application Note 358–2—"HP 5371A Frequency and Time Interval Analyzer, Jitter and Wander Analysis in Digital Communications", pp. 1–20, Jun., 1988, Palo Alto, CA.

Hewlett–Packard Application Note 200, Electronic Counter Series—"Fundamentals of the Electronic Counters", 1997, Palo Alto, CA.

"Technical Resources", http://wavecrestcorp.com/Technical/Jitter.html, 1998–1999.

"A Continuous Time Stamping Time Digitizer Architecture for High Energy Physics Applications", Gorbics, et al., Chestnut Ridge, NY, Oct., 1996, 5 pages.

"The Time Marker Data Acquisition System for Belle an Example of the LeCroy–Laboratory Collaboration Program", Blanar and Sumner, Chestnut Ridge, NY, Oct., 1996, 6 pages.

"A High Resolution Multihit Time–to–Digital Converter Integrated Circuit", Gorbics, et al., Chestnut Ridge, NY, Nov., 1996, 7 pages.

"LeCroy MQT300 Charge–to–Time Converter", Yamrone, et al., Chestnut Ridge, NY, Nov., 1996, 3 pgs.

"A 9U VME 96–Channel Time–to–Digital Converter Module", Uhmeyer, et al., Chestnut Ridge, NY, Oct., 1996, 6 pages.

"New Techniques for Measuring Time Intervals with Very High Resolution", Sumner and Blanar, Aug. 1996, 7 pages.

Wavecrest Corporation DTS 2070/2075 Time Measuring Device Block Diagram.

* cited by examiner

*Primary Examiner*—Vit Miska
(74) *Attorney, Agent, or Firm*—Dority & Manning, P.A.

(57) ABSTRACT

A time interval analyzer includes a signal channel that receives an input signal. A plurality of measurement circuits are defined within the signal channel in parallel with each other. Each measurement circuit is configured to receive the input signal, measure an occurrence of a first event of the input signal with respect to a predetermined time reference and to output a time signal corresponding to the measurement of the occurrence. A processor circuit is in communication with the signal channel. It is configured to receive and compare time signals from the measurement circuits to each other to determine a time interval between the first event measured by a first measurement circuit and an event measured by a second measurement circuit.

20 Claims, 8 Drawing Sheets

TIME INTERVAL ANALYZER HAVING MULTIPLE MEASUREMENT CIRCUITS

BACKGROUND OF THE INVENTION

In general, an integrated circuit refers to an electrical circuit contained on a single monolithic chip containing active and passive circuit elements. As should be well understood in this art, integrated circuits are fabricated by diffusing and depositing successive layers of various materials in a preselected pattern on a substrate. The materials can include semiconductive materials such as silicon, conductive materials such as metals, and low dielectric materials such as silicon dioxide. The semiconductive materials contained in integrated circuit chips are used to form almost all of the ordinary electronic circuit elements, such as resistors, capacitors, diodes, and transistors.

Integrated circuits are used in great quantities in electronic devices such as digital computers because of their small size, low power consumption and high reliability. The complexity of integrated circuits range from simple logic gates and memory units to large arrays capable of complete video, audio and print data processing. Presently, however, there is a demand for integrated circuit chips to accomplish more tasks in a smaller space while having even lower operating voltage requirements.

Currently, the semiconductor industry is focusing its efforts on reducing dimensions within each individual integrated circuit in order to increase speed and to reduce energy requirements. The demand for faster and more efficient circuits, however, has created various problems for circuit manufacturers. For instance, a unique problem has emerged in developing equipment capable of testing, evaluating and developing faster chips. Timing errors and pulse deviations may constitute a greater portion of a signal period at higher speeds. As such, a need exists not only for devices capable of detecting these errors but also devices capable of characterizing and identifying the errors.

In the past, electronic measurement devices have been used to test integrated circuits for irregularities by making frequency and period measurements of a signal output from the circuit. Certain devices, known as time interval analyzers, can perform interval measurements, i.e. measurements of the time period between two input signal events, and can totalize a specific group of events. A time interval analyzer generally includes a continuous time counter and a continuous event counter. Typically, the device includes a measurement circuit on each of a plurality of measurement channels. Each channel receives an input signal. By directing a signal across the channels to a given measurement circuit so that the circuit receives two input signals, the circuit is able to measure the time interval between two events in the signals. Such devices are capable of making millions of measurements per second.

Measurement devices based exclusively on counters, however, are unable to directly measure time intervals. In very general terms, a counter refers to an electronic device that counts events, for example pulses, on an input signal. The measurement device also typically includes a frequency standard or clock to measure the time period during which the counter is activated. Thus, the measurement device measures the number of input signal events that occur over a known time period and, therefore, measures the frequency of the events. In other words, clocks contained in counters generate a signal at a known frequency which is then used to measure the frequency of other signals.

By measuring certain characteristics of a signal emitted by an integrated circuit, time interval analyzers and counter-based measurement devices can be used to detect timing errors that may be present within the circuit. This information can then be used to assist in developing an integrated circuit or for detecting defects in mass-produced circuits.

Timing errors on integrated circuit signals are generally referred to as "jitter." Jitter, broadly defined as a deviation between a real pulse and an ideal pulse, can be a deviation in amplitude, phase, and/or pulse width. Jitter typically refers to small, high frequency waveform variations caused by mechanical vibrations, supply voltage fluctuations, control-system instability and the like.

Instruments such as time interval analyzers, counter-based measurement devices and oscilloscopes have been used to measure jitter. In particular, time interval analyzers can monitor frequency changes and frequency deviation over time. In this manner, they not only detect jitter, but can also characterize jitter so that its source can be determined. Generally, however, conventional devices, including time interval analyzers, are too slow to provide reliable measurements at the speed and frequency of high-speed integrated circuits.

SUMMARY OF THE INVENTION

The present invention recognizes and addresses the foregoing considerations, and others, of prior art constructions and methods.

Some of these objects are achieved by a time interval analyzer for measuring time intervals between signal events. The analyzer includes a signal channel that receives an input signal. A plurality of measurement circuits are defined within the signal channel in parallel with each other. Each measurement circuit is configured to receive the input signal, measure an occurrence of a first event of the input signal with respect to a predetermined time reference and to output a time signal corresponding to the measurement of the occurrence. A processor circuit is in communication with the signal channel. The processor circuit is configured to receive and compare the time signals from the measurement circuits to each other to determine a time interval between the first event measured by a first measurement circuit and an event measured by a second measurement circuit.

The accompanying drawings, which are incorporated in and constitute a part of this specification, illustrate one or more embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended drawings, in which.

Figure 1:
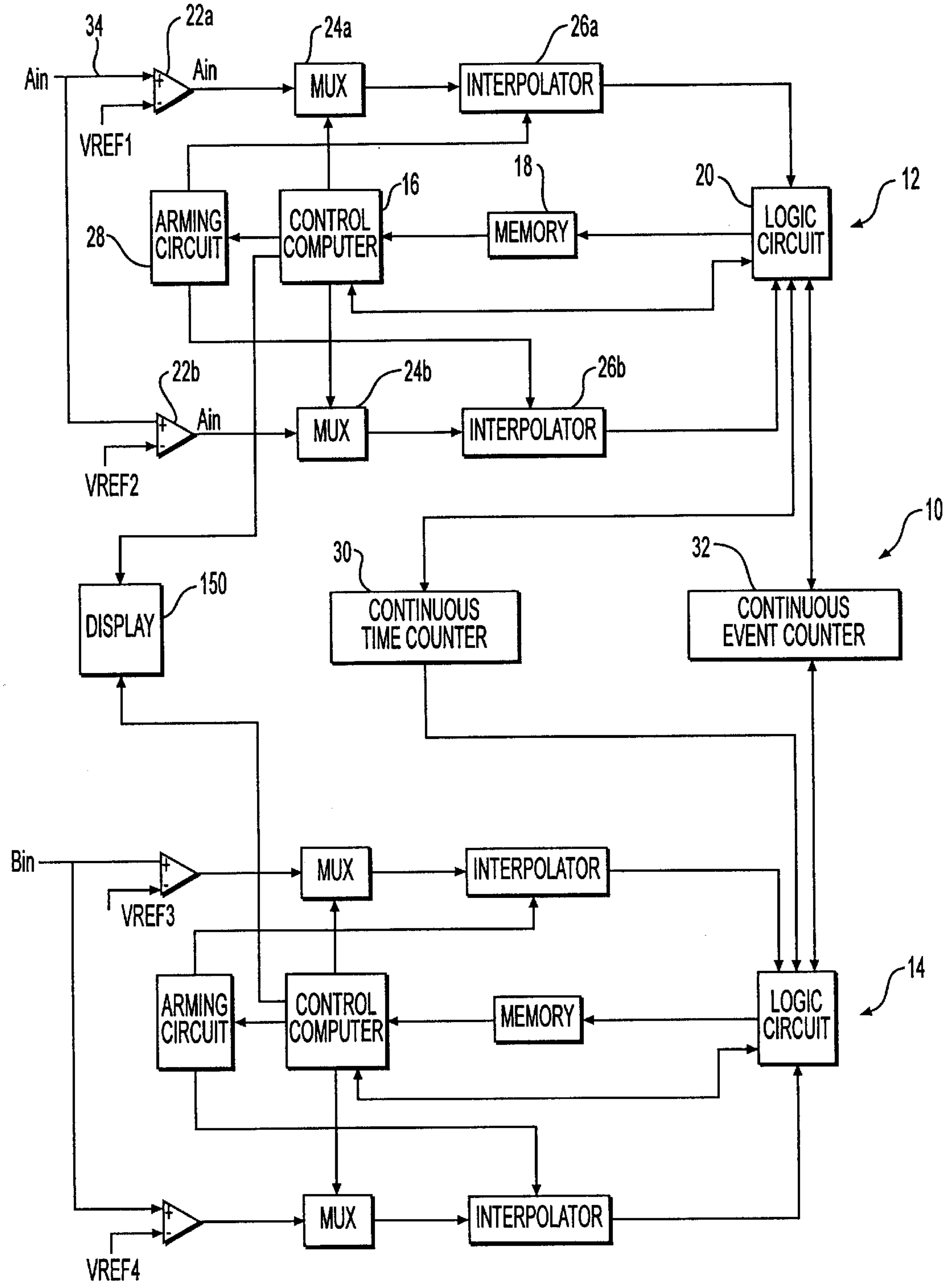
FIG. 1 is a block-diagram illustration of a time interval analyzer in accordance with a preferred embodiment of the present invention.

Repeat use of reference characters in the present specification and drawings is intended to represent same or analogous features or elements of the invention.

DETAILED DESCRIPTION OF PREFERRED EMBODIMENTS

Reference will now be made in detail to presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope and spirit thereof. For instance, features illustrated or described as part of one embodiment may be used on another embodiment to yield a still further embodiment. Thus, it is intended that the present invention covers such modifications and variations as come within the scope of the appended claims and their equivalents.

The Time Interval Analyzer

Referring to FIG. 1, a time interval analyzer 10 includes two channels indicated at 12 and 14. Each channel includes a control computer 16, for example a 200 MHz DSP processor, with associated memory 18, for example a high-performance FIFO memory, and a logic a circuit 20. Alternatively, the channels may share a common computer, memory and logic circuit, which may be collectively referred to as a processor circuit. Each channel, in turn, includes parallel measurement circuits having comparators 22*a* and 22*b*, multiplexers 24*a* and 24*b* and interpolators 26*a* and 26*b*. That is, each channel includes multiple, in this case two, measurement circuits. An arming circuit 28 is controlled by computer 16 to trigger the interpolators. A continuous time counter 30 and continuous event counter 32 provide time and event counts to both channels 12 and 14. Alternatively, each measurement circuit may have its own time counter and event counter, provided that the respective counters for each measurement circuit are synchronized.

Channels 12 and 14 are mirror images of each other. Thus, while the following discussion is directed primarily to channel 12, it should be understood that the construction of channel 14 is the same.

As indicated in the Background section above, the present invention is directed to a time interval analyzer for measuring one or more desired characteristics of an input signal. Preferably, the device is configured to measure signals having frequencies up to approximately 1 GHz. Thus, preferred embodiments employ ECL components, although it should be understood that CMOS components may be used where capable of propagating signals at adequate speeds for measuring such high-frequency signals.

Referring to channel 12, an input signal $A_{in}$ is directed on a signal line 34 to the positive inputs of comparators 22*a* and 22*b*. Preferably, the comparators are high-speed ECL devices such as MC10E1652 comparators from Motorola. Each comparator compares $A_{in}$ to reference voltages VRef1 and VRef2, respectively, so that the output of each comparator changes state as $A_{in}$ moves above and below the reference voltage. The values of VRef1 and VRef2 depend, generally, on the construction of the comparators. For example, ECL signals typically range between −0.8V and −1.8V. VRef1 and VRef2 may therefore be set to the mid-point of this range.

Figure 2:
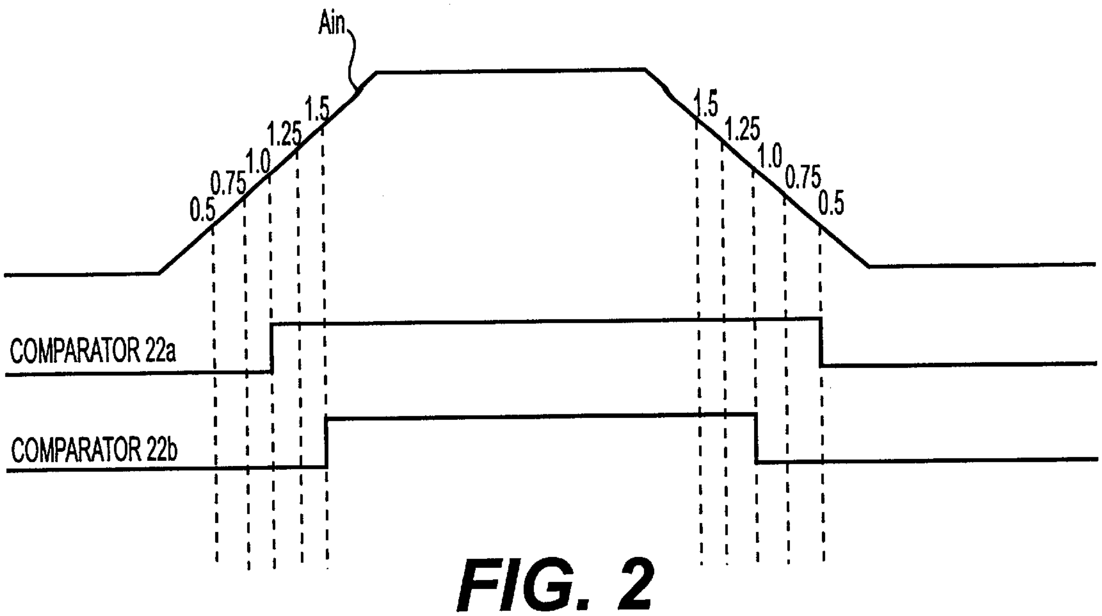
FIG. 2 is a graphical illustration of the operation of a time interval analyzer in accordance with a preferred embodiment of the present invention.

The reference voltages may also, however, vary from each other. For example, comparators 22*a* and 22*b* typically include hysteresis to avoid false triggers. That is, assuming that Vref1 and Vrefz are both equal to 1V, comparators 22*a* and 22*b* might go high when $A_{in}$ rises above 1.25V and low when $A_{in}$ drops below 0.75V. Where VRef1 and VRef2 are respectively set to 0.75V and 1.25V, however, as shown in FIG. 2, the output of comparator 22*a* goes high when the rising edge of $A_{in}$ rises above 1V and low when the falling edge of $A_{in}$ falls below 0.5V. The output of comparator 22*b* goes high when the rising edge of $A_{in}$ rises above 1.5V and low when the falling edge of $A_{in}$ drops below 1V. Accordingly, comparators 22*a* and 22*b* combine to precisely detect the rising and falling edges of $A_{in}$ at 1V while maintaining their hysteresis protection against false triggers.

As indicated in FIG. 2, comparators 22*a* and 22*b* output binary signals having rising edges at the rising edges of $A_{in}$. These binary signals are output to multiplexers 24*a* and 24*b*. As discussed below, each multiplexer in the illustrated preferred embodiment has four inputs. For purposes of the present discussion, however, it is assumed that the multiplexers gate the comparator outputs, in their positive, inverse or differential forms, to interpolators 26*a* and 26*b*.

Arming circuit 28 triggers the interpolators. Once triggered, each interpolator determines the time between receipt of the next rising edge on the signal from its comparator and a known time reference, for example a rising edge of some subsequent clock pulse provided by the time base. As should be understood in this art, the time base may be provided by a quartz crystal oscillator, for example at a period of 20 ns.

The time measurement is based on the charge or discharge rate of a capacitor within the interpolator. Following arming of the interpolator, the next rising edge from the comparator begins the capacitor's charge or discharge. The subsequent clock pulse edge, however, stops the charge or discharge so that the voltage at the capacitor reflects the time between the signal's rising edge and the clock pulse. That is, the capacitor voltage comprises a time signal that corresponds to the occurrence of the signal edge to a predetermined time reference.

The interpolator outputs the time signal to computer 16 and notifies logic circuit 20, primarily comprised of a field programmable gate array (FPGA), that a measurement has occurred. The FPGA also receives the output of continuous time counter 30 and continuous event counter 32. The time counter is embodied entirely by the FPGA and is driven by the time base to count time base pulses. Assuming a 20 ns time base, time counter 30 is a 50 MHz counter. As discussed in more detail below, however, the event counter is comprised of multiple counters, including two parallel ECL 8-bit counters and a 37-bit counter embodied by logic circuit 20, that are driven by the signal passed from the multiplexer so that the event counter sequentially counts pulses in the multiplexer signal. Although a single time counter and a single event counter are illustrated in FIG. 1, it should be understood that a counter pair may be provided for each channel 12 and 14.

At the next time base clock pulse after receiving notification that the interpolator has measured a signal edge, the logic circuit (1) instructs the computer to read the interpolator measurement from the measurement capacitor and (2) reads the time and event counts from counters 30 and 32. It then downloads the time and event counts to memory 18, from which computer 16 retrieves the information to assign to the signal measurement. In this manner, the processor circuit correlates the measured signal edge with time and event measurements from the counters. Thus, a "measurement tag" indicates the time the signal edge occurred and the edge's position within the sequence of edges. In a preferred embodiment, the time count is calibrated to a predetermined time reference so that the measurement tag reflects the real time at which the rising signal edge occurred.

The first measurement circuit **22*a*–26*a*/20 may be referred to as the "start" measurement circuit, while the second measurement circuit 22*b*–26*b*/20 may be referred to as the "stop" measurement circuit. Generally, time interval analyzer 10 measures characteristics of a desired signal by comparing the time and/or event measurements of the start circuit with that of the stop circuit. The particular measurement depends upon the signal selected at multiplexers 24*a* and 24*b* and upon the manner in which arming circuit 28 arms the interpolators. For example, if the start circuit multiplexer passes the $A_{in}$ signal from comparator 22*a* as shown in FIG. 1, if the stop circuit multiplexer passes the inverse of the $A_{in}$ signal from comparator 22*b*, and if interpolator 22*b* is armed immediately following interpolator 26*a***, but before the expiration of a period equal to the input signal pulse width, the difference between the time portions of the start and stop measurement tags is equal to the pulse width. A more detailed discussion regarding how measurements may be selected is provided below.

The logic circuit outputs to FIFO memory 18 at each clock pulse. Control computer 16 repeatedly reads the memory to perform a desired analysis and/or to display the measured information at a display device 150, for example a video monitor. The control computer also controls the arming circuit and the multiplexer inputs to effect a desired measurement.

As should be understood in this art, the FPGA of logic circuit 20 is a programmable device having a multitude of transistors that can be selectively connected using synthesizer software such as VHDL. That is, once the FPGA's desired functions are known, they can be entered into the software which, in turn, controls a suitable device to program the FPGA to perform these functions. It should be within the skill of one of ordinary skill in this art to program an FPGA in accordance with the present invention in light of the present discussion, and a particular FPGA configuration is therefore not discussed in detail herein.

The arrangement illustrated in FIG. 1 may also be used to compare characteristics of input signals $A_{in}$ and $B_{in}$. Because these signals are processed on separate channels, error induced by crosstalk and cross-channel switching circuitry is reduced. A "channel" as referred to herein includes one or more parallel measurement circuits, each of which may be driven by an external signal received from the same input port on the time interval analyzer. However, signals may cross from one channel to another to be used as desired in a given measurement. Preferably, the channels are isolated from each other except for the cross signals, and each channel has its own power supply.

Figure 3:
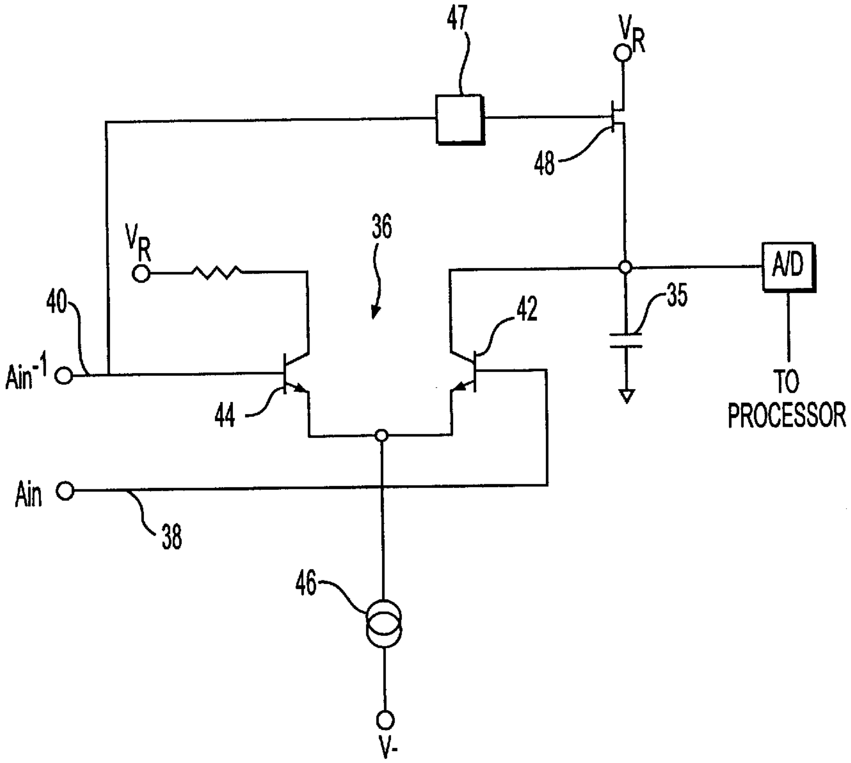
FIG. 3 PRIOR ART
FIG. 3 is an electrical schematic illustration of a prior art time interval analyzer.

As described above, the interpolator's time period measurement is related to the charge or discharge of a capacitor. FIG. 3 provides a prior art arrangement for effecting a time period measurement using a capacitor. Generally, a capacitor 35 is discharged by a differential transistor pair 36 that is, in turn, controlled by the input signal $A_{in}$ and its inverse $A_{in}^{-1}$ provided on lines 38 and 40. Prior to a measurement, $A_{in}$ is low, and $A_{in}^{-1}$ is high. Thus, transistor 42 is off, and transistor 44 is on. A constant current source 46 therefore draws current through transistor 44 but not through transistor 42.

A positive edge of input signal $A_{in}$, however, reverses the states of transistors 42 and 44. Constant current source 46 then draws current through transistor 42, thereby discharging capacitor 34. At the end of the pulse, lines 38 and 40 and transistors 42 and 44 return to their original states, thereby ending the discharge of capacitor 35. The decrease in the capacitor's voltage is proportional to the time transistor 42 was activated and, therefore, the period of the signal pulse. A control circuit 47 driven by the signal on line 40 measures the voltage across capacitor 35 at the end of the pulse on lines 38 and 40. Since the capacitor's original voltage is known, the change in voltage indicates the pulse length.

The circuit must then drive capacitor 35 back to its original voltage level. The input signal, through control circuit 47, controls a FET 48 that gates a reference voltage $V_K$ to capacitor 35. Normally, the control circuit activates the FET so that reference voltage $V_K$ is constantly applied to the capacitor, thereby maintaining the capacitor in a charged state. When a pulse is received on lines 38 and 40, the signal's state change causes control circuit 47 to close the FET. At the end of the pulse, the FET is reopened.

FET 48 introduces error to the interpolator measurement. For example, the switching of the FET must be closely synchronized to the input signal pulse and, even where synchronized, injects an error current into the capacitor discharge. Further, the FET typically exhibits some leakage from reference voltage $V_K$ into the capacitor.

The Interpolator

1. The Trigger Circuit

Figure 4A:
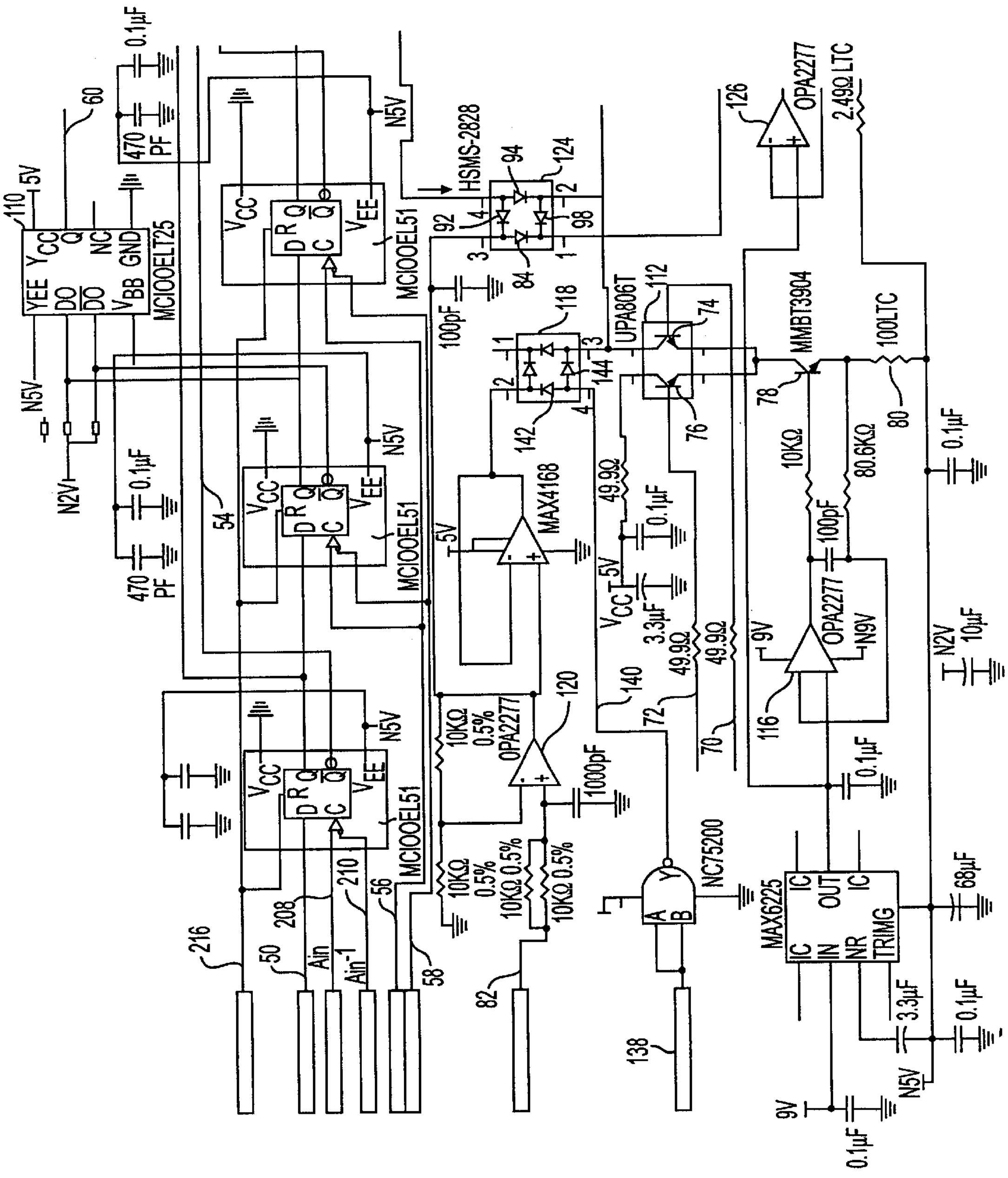
FIGS. 4A and 4B are an electrical schematic illustration of an interpolator for use in a time interval analyzer in accordance with a preferred embodiment of the present invention.
Figure 4B:
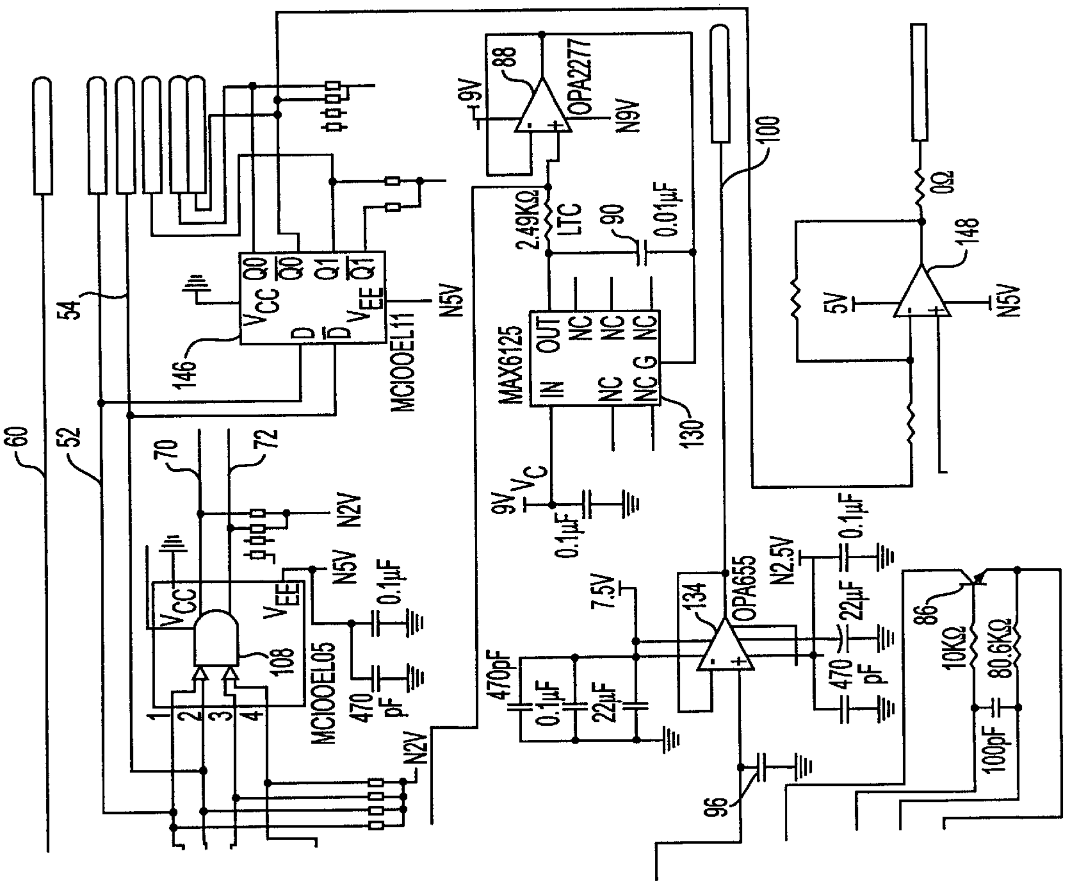

Referring now to FIGS. 4A and 4B (hereafter collectively referred to as FIG. 4), an interpolator 26 according to one preferred embodiment of the present invention includes a trigger circuit having three flip flops 102, 104 and 106. As should be well understood in this art, a flip flop gates its D input to its Q output, and the inverse of the D input to its $Q^{-1}$ output, at each rising edge of its clock input. For example, the D input to flip flop 102 is an output signal 50 received from arming circuit 28 (FIG. 1). Prior to enabling a measurement, the arming signal 50 is low. Thus, regardless of the flip flop's clock input, the Q and $Q^{-1}$ outputs are low and high, respectively.

As indicated in the figure, the flip flop clock inputs are differential signals. That is, each input is equal to the difference between the clock input signal and the inverse of the clock input signal. As should be understood in this art, this reduces the effect of signal noise, which would be present on both lines, and is a typical signal format for use with ECL components. Thus, if the input signal is 0, the differential input is −0.8V. If the input signal is 1, the differential input is 0.8V. For ease of explanation, differential inputs indicated in the figures may be referred to in the present description simply as an input signal.

When the arming circuit outputs an enabling signal on line 50 (that is, when the signal on line 50 goes high), the Q and $Q^{-1}$ outputs of flip flop 102 remain low and high, respectively, until the flip flop receives a rising edge at its clock input. The clock input is the differential signal from multiplexer 24*a* ($A_{in}$ and $A_{in}^{-1}$ where the time interval analyzer's input signal $A_{in}$ is selected at the multiplexer). Thus, the flip flop 102's $Q/Q^{-1}$ output changes state at the first rising edge of the input signal $A_{in}$ that follows the enabling signal from the arming circuit. This is the signal edge to which the measurement circuit assigns a measurement tag and is hereafter referred to as the "measured edge."

The differential output signal formed by the Q and $Q^{-1}$ outputs of flip flop 102 is directed to arming circuit 28 (FIG. 1) on lines 52 and 54 to potentially trigger the parallel measurement circuit 22*b*–26*b*/20 (FIG. 1) and to instruct the logic circuit to assign the event portion of the measurement tag, as described in more detail below. The $Q/Q^{-1}$ output is also directed to a differential AND gate 108 that controls the discharge of the interpolator's measurement capacitor.

Furthermore, the differential output from flip flop 102 is directed to a buffer 146 and thereafter to an op amp 148 that amplifies the signal and outputs to an analog-to-digital converter (not shown). Control computer 16 (FIG. 1) reads the converter and drives display device 150 to display a message indicating that a measurement has occurred.

The Q output of flip flop 102 is directed to the D input of flip flop 104. Since flip flop 102's Q output is low until the measured edge, flip flop 104's $Q/Q^{-1}$ output is low/high until the D input receives this edge. In other words, the measured edge enables flip flop 104. Flip flop 104's clock signal is the differential time base clock signal at lines 56 and 58. Thus, the flip flop's Q and $Q^{-1}$ outputs change state at the rising clock edge that follows the measured edge.

The differential output formed by the Q and $Q^{-1}$ outputs of flip flop 104 is directed to an ECL/TTL converter 110 that outputs a TTL signal corresponding to the flip flop's differential output on line 60 to logic circuit 20 (FIG. 1). The output of flip flop 104, as converted to a TTL level on line 60, enables the logic circuit to assign the time portion of the measurement tag, as discussed below.

The third flip flop 106 receives the Q output from flip flop 104 as its D input. Thus, it is enabled at the occurrence of the first time base clock pulse following the measured edge. Its clock input is also the time base clock signal on lines 56 and 58. Accordingly, its Q and $Q^{-1}$ outputs change state upon the rising edge of the second clock pulse following the measured edge.

Figure 5:
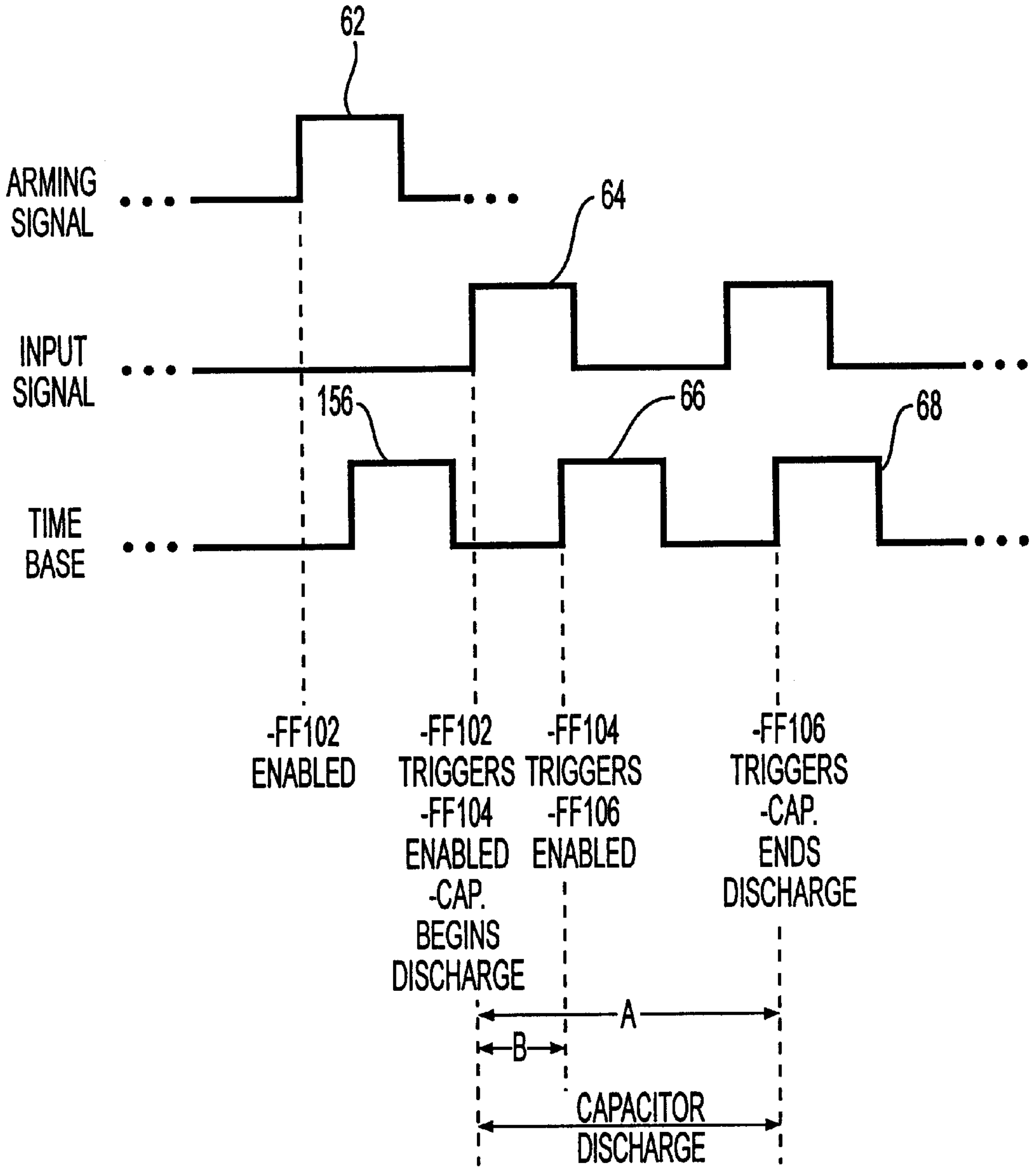
FIG. 5 is a graphical illustration of the operation of a time interval analyzer in accordance with a preferred embodiment of the present invention.

FIG. 5 illustrates the trigger circuit's operation with respect to the arming circuit enabling signal, the selected input signal from multiplexer 24*a*, and the time base clock signal. Prior to a pulse 62 on line 50 from the arming circuit, the Q output of each flip flop 102, 104 and 106 is low. At the rising edge of pulse 62, however, flip flop 102 enables. At the rising (measured) edge of the following input signal pulse, indicated at 64, flip flop 102's Q and $Q^{-1}$ outputs change state, enabling flip flop 104 and beginning the discharge of the interpolator's measurement capacitor. At the rising edge of the following time base clock pulse, indicated at 66, flip flop 104's Q and $Q^{-1}$ outputs change state, and flip flop 106 enables. At the rising edge of the next time base clock pulse, indicated at 68, flip flop 106's Q and $Q^{-1}$ outputs change state, completing the capacitor's discharge.

Thus, the interpolator's measurement capacitor discharges during a period A between the rising edge of pulse 64 (the measured edge) and the rising edge of pulse 68. In general, the interpolator measures the period between the measured edge and some subsequent reference event, such as a time base clock pulse. Thus, the measurement period could be the period B between the measured edge and the rising edge of pulse 66. Measurement A, however, assures that there will be a measurable voltage difference across the measurement capacitor. For example, if the circuit were configured so that the capacitor discharged only between the rising edges of pulses 64 and 66, there would be no discharge where the pulses occurred at the same instant. Using the additional flip flop stage to extend the measurement period to the second clock pulse assures that the capacitor will discharge for at least one clock period.

Returning to FIG. 4, the differential inputs to AND gate 108 are the $Q/Q^{-1}$ output of flip flop 102 and the inverse $Q/Q^{-1}$ output of flip flop 106. Thus, before flip flop 102 triggers, the AND gate sees a low signal from flip flop 102 and a high signal from flip flop 106, and the gate's output is therefore low. When flip flop 102 triggers at the measured edge, both inputs to the AND gate are high, and its output therefore goes high. As indicated in FIG. 5 and as discussed below, this begins the measurement capacitor's discharge. When the output from flip flop 106 goes high at the rising edge of the second clock pulse, the inverse input to the AND gate goes low, and the gate's output goes low, thereby ending the capacitor's discharge.

2. The Shunt Circuit

The output from AND gate 108 is a differential signal on lines 70 and 72 that controls a shunt circuit that includes a differential pair 112 having a pair of high-frequency microwave transistors 74 and 76. Normally, the shunt circuit presents an open circuit to the measurement capacitor at transistor 74 and allows current to pass through transistor 76. More specifically, when the AND gate output is low, the signal on line 72 is high, and the signal on line 70 is low. Thus, transistor 74 is deactivated, and transistor 76 is activated.

Differential pair 112 feeds to a constant current source established by a stable voltage source and a resistor. The voltage source is comprised of a 2.5 V reference chip (for example a MAX6225 voltage reference available from Maxim Integrated Products, Inc. of Sunnyvale, Calif.) that outputs to an op-amp 116 that, in turn, controls an npn transistor to maintain a stable 2.5V level above a 100 ohm low thermal coefficient resistor 80. The npn transistor arrangement could be replaced by a FET arrangement, as should be understood by those skilled in this art. The 2.5V level across resister 80 draws a 25 milliamp(ma) current through differential pair 112. When transistor 76 is on, and transistor 74 is off, current is drawn from a 5V source $V_{cc}$ through transistor 76.

A diode bridge 118 is disposed upstream from transistor 74. A 3.75V level is maintained at intermediate pin 2 of bridge 118 on line 82 through op amps 120 and 122. Line 82 is received from control computer 16 (FIG. 1), which maintains the 3.75V level by software.

Op amp 120 also maintains a 3.75V level at intermediate pin 3 of a diode bridge 124. Pin 3 connects through a diode 84 and output pin 1 to a 1 ma current sink formed by 2.5V source 114, an op amp 126 and an npn transistor 86 that maintains a 2.5 V level above a 2.49 kohm low thermal coefficient resistor 128.

A 1 ma current is applied to input pin 4 of bridge 124 by a constant current source comprised of a 2.5 V reference 130

(for example a MAX6125 voltage reference available from Maxim Integrated Products) driven by a floating reference $V_f$, an op amp 88, a 2.49 kohm low thermal coefficient resister 132 and a 0.01 microF capacitor 90.

The 1 ma current into input pin 4. of bridge 124 may pass through either or both of diodes 92 and 94, depending on the voltage levels at intermediate pins 2 and 3. As described above, pin 3 is held at 3.75 V. If the voltage across a 560 picoF capacitor 96 (the interpolator's measurement capacitor) is less than 3.75V, the 1 ma current passes through diode 94 and charges the capacitor. When the voltage across the capacitor reaches 3.75 V, however, pins 2 and 3 of diode bridge 124 are balanced, and the current splits between diodes 92 and 94, and between diodes 84 and 98, to the 1 ma current sink at output pin 1. That is, when the voltage level at pin 2 is less than the level at pin 3, capacitor 96 charges through diode 94 from the 1 ma current source established by reference 130 while the current sink established by reference 114 draws through diode 84 from the 3.75V source. When capacitor 96 fully charges to 3.75V, pins 2 and 3 balance, and the entire 1 ma current from the reference 130 source passes evenly through the two halves of bridge 124 to the current sink. Should capacitor 96 leak, the voltage at pin 2 of bridge 124 drops slightly, and current is drawn through diode 94 from the 1 ma source driven by reference 130 to recharge the capacitor to the 3.75V level.

Thus, while the output of AND gate 108 remains low, bridge 124 and the current source driven by voltage source 130 maintain measurement capacitor 96 at 3.75V. When the AND gate output goes high, however, the level on lines 70 and 72 change state, activating transistor 74 and deactivating transistor 76. The 25 ma current sink driven by voltage reference 114 and resistor 80 then draws 25 ma through transistor 74, allowing capacitor 96 to discharge through transistor 74. As the capacitor discharges, the voltage level at pin 2 of diode bridge 124 drops, causing current from the 1 ma source driven by voltage reference 130 to pass through diode 94 and transistor 74 to the 25 ma sink. Thus, the current sink draws 24 ma from capacitor 96.

Capacitor 96 continues to discharge until the output of AND gate 108 returns low. This causes transistor 74 to turn off, thereby blocking the capacitor's discharge path. Thus, the shunt circuit changes from a non-conducting state between the constant current source and the current sink to a conducting state, and vise-versa, responsively to the trigger circuit to define a discharge period for measurement capacitor 96.

It should be understood, however, that the circuitry could be configured to normally maintain capacitor 96 in a discharged state, wherein the trigger circuit controls the shunt circuit to charge the capacitor during the measurement period so that the charge increase across the capacitor corresponds to the measurement period. In such a configuration, npn transistors 74 and 76 are replaced by pnp transistors, and the transistor pair is disposed between a 1 ma constant current sink and a 25 ma current source. The measurement capacitor is connected to the constant current sink so that the transistor pair and the capacitor form parallel inputs to the constant current sink. Normally, the transistor between the 25 ma source and the 1 ma constant sink is off, and the capacitor discharges to the sink. The 25 ma current flows through the second transistor to a resistor or other suitable circuitry. Upon receiving the trigger signal at a triggering level, however, the first transistor activates, directing 1 ma to the constant sink and 24 ma to the capacitor. When the transistor pair switches back to its original state at the measurement's end, the increased voltage across the capacitor corresponds to the measurement period.

Accordingly, in either of the discharge embodiment (FIG. 4) or the charge embodiment described above, there is a first current circuit that is either a constant current source or a constant current sink. The transistor pair and the measurement capacitor are disposed in parallel with respect to the first current circuit. A second current circuit is (1) a current sink where the first current circuit is a constant current source or (2) a current source where the second current circuit is a constant current sink.

3. The Edge Measurement

As indicated in the discussion above with respect to FIG. 5, capacitor 96 discharges for a period of from one to two time base clock periods. Following the rising edge of the time base clock pulse that returns AND gate 108 to its low output (pulse 68 in FIG. 5), control computer 16 (FIG. 1) reads the voltage level on capacitor 96 from a fourteen-bit analog-to-digital converter (not shown) from a line 100. A 400 MHz FET input op amp 134 (for example an OPA655 available from Burr-Brown Corporation of Tucson, Ariz.) amplifies and outputs the capacitor's voltage to the analog-to-digital converter over line 100.

The logic circuit downloads the time and event portions of the measurement tag to the computer so that the occurrence of the rising edge of pulse 64 is measured with respect to a known time reference and is identified in numerical position. As discussed above, and referring also to FIGS. 1 and 5, the output of ECL/TTL converter 110 notifies logic circuit 20 at the rising edge of clock pulse 66, when the output of flip flop 104 changes state, that a measurement is occurring. The logic circuit then reads the time counter and downloads the time count and the event count to FIFO memory 18. The propagation delay in making the counter reading is approximately three clock pulses. That is, the actual time counter reading corresponds to the third clock pulse following pulse 66. However, this delay is consistent and also appears in measurements made by the stop measurement circuit. Thus, where real time measurements are desired, the continuous time counter may be calibrated to account for the delay. Where the device is used to measure the period between start and stop measurements, the delay is subtracted out.

Control Computer 16 repeatedly reads memory 18. Upon receiving the time tag information, the computer knows a measurement has occurred and therefore reads the voltage across capacitor 96 through the analog-to-digital converter (not shown) and op amp 134. Accordingly, the computer knows (1) the period between the rising edges of pulses 64 and 68, as represented by the voltage change across capacitor 96, (2) the time of the rising edge of pulse 68, through the time counter read, and (3) the numerical position of pulse 64, for example within a series of signal pulses, through the event counter read. The computer therefore knows the time and position at which the rising (measured) edge of pulse 64 occurred. It should be understood that there may be a variety of forms in which this information may be represented within or presented by the computer. The particular form may depend upon the measurement being performed and the programming arrangement of computer 16.

Furthermore, as those skilled in this art should understand, a certain period of time is required for the circuit components to settle before the computer may accurately measure the capacitor's voltage level. This period may be generally determined from the circuit part specifications. In one preferred embodiment including an interpolator as in FIG. 4, control computer 16 measures the voltage at capacitor 96 approximately 10 clock pulses following pulse 68. Fifteen additional clock pulses are required before the next measurement to allow the capacitor to recharge, and the computer therefore does not rearm an interpolator until at least 300 ns has elapsed. Prior to the next measurement, the logic circuit clears the trigger circuit flip flops 102, 104 and 106 with a signal over line 216 (FIG. 4).

4. The Boost Circuit

Following the measurement, the 1 ma constant current source driven by voltage reference 130 charges capacitor 96 up to 3.75V at an approximately linear rate without the asymptotic slope that would occur if the capacitor were charged by a voltage source. Were there no other charge source, the constant current source shown in FIG. 4 would charge the capacitor in approximately 600 ns. To reduce the charge time to approximately 100 ns, logic circuit 20 (FIG. 1) provides a current boost through a NAND gate 136 and bridge circuit 118.

In general, the NAND gate provides a rising voltage transition between the current source and the measurement capacitor so that the capacitor charges with the transition. The inputs to NAND gate 136 on line 138 are normally high so that the gate's output on line 140 is normally low. After a time delay following the computer's measurement of capacitor 96 through the analog-to-digital computer sufficient to assure that the measurement is complete, the logic circuit drives the signal on line 138 low, thereby causing line 140 to go high. As should be understood in this art, the transition of the signal on line 40 from low to high is not instantaneous. As it begins to rise, the voltage level at input pin 4 of bridge 118 is lower than the 3.75V level on intermediate pin 2. Thus, diode 142 is reverse biased, and current flows through diode 144 and output pin 3 to charge capacitor 96. The voltage across capacitor 96 rises with the voltage on line 140 until the voltage at input pin 4 reaches 3.75V. At this point, diode 142 begins to forward bias. Since current cannot flow into the voltage source from pin 2, however, pin 4 is held at 3.75 V. Capacitor 96, which slightly lags the voltage on line 140, continues to charge from the 1 ma current source. When it reaches 3.75V, pins 2, 3 and 4 of bridge 118, and pins 2 and 3 of bridge 124, are balanced, and the charge is complete.

A full four-diode bridge is used at 118 for convenience of construction and because the diodes in a pre-packaged bridge circuit are matched, thereby providing a relatively precise balance at the intermediate nodes. It should be understood, however, that a half bridge having two discrete diodes 142 and 144 may be used in place of the full bridge.

Furthermore, where the interpolator is configured in the charge embodiment discussed above, the boost signal is inverted so that a falling edge is applied between the first current circuit and the capacitor.

The Continuous Time Counter

Presently, it is difficult or impossible to read a discrete hardware counter operating at a high speed (greater than about 100 MHz for TTL and 500 MHz for ECL) because the counter's output never stabilizes. Even if the output were to stabilize, however, the time necessary to read the counter is greater than the time in which the counter changes state. Thus, there could be no confidence in the counter reading. As discussed above, however, continuous time counter 30 is embodied within the logic circuit's FPGA, which can read the clock up to frequencies within a general range that includes 50 MHz. As should be understood in this art, the FPGA accurately reads its internal clock to determine the time portion of the measurement tag.

The Continuous Event Counter

Figure 6:
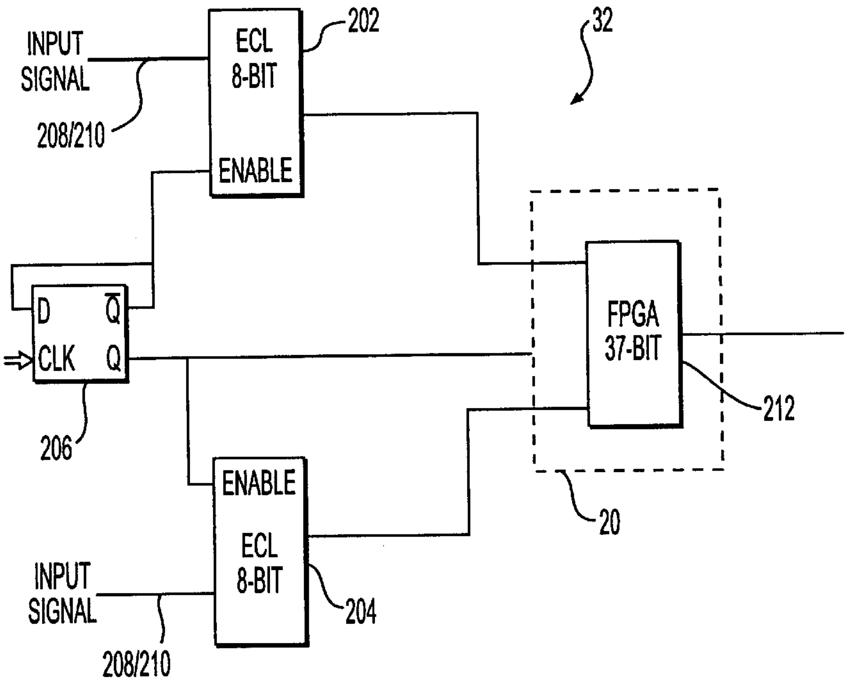
FIG. 6 is a block diagram illustration of a time interval analyzer in accordance with a preferred embodiment of the present invention.

Because event counter 32 counts ECL input signal pulses, and because the event counter may increment at a frequency greater than 50 MHz, the event counter includes a discrete hardware counter stage upstream from the FPGA. Referring to FIG. 6, the hardware counter stage includes two parallel eight-bit ECL-logic counters 202 and 204, each of which is enabled by a flip flop 206. Specifically, the flip flop's $Q^{-1}$ output enables counter 202, while the Q output enables counter 204. Thus, the flip flop controls the counters so that only one is enabled at any time. Furthermore, the flip flop's $Q^{-1}$ output is fed back to its D input so that the flip flop output changes state at the rising edge of each pulse in its clock input. Referring also to FIG. 4, the flip flop's clock input is the $Q/Q^{-1}$ output from flip flop 102. Since flip flop 102 changes state at every measured edge, event counter 32 transitions between hardware counters 202 and 204 at every measured edge. Since each counter counts the rising edges of pulses on the signal that includes the rising edge (the differential signal on lines 208/210 from multiplexer 22*a* (FIG. 1)), the count on the counter 202 or 204 that is stopped upon detection of the measured edge corresponds to the measured edge's position in the sequence of rising edges in the input signal.

The overflow bit from each counter 202 and 204 triggers a 37-bit counter 212 in the FPGA. That is, whenever the count of either counter 202 or 204 reaches 255, the next count increments FPGA counter 212.

In operation, assume that counter 202 is actively counting input signal pulses from lines 208/210. When flip flop 102 is enabled, the next input signal pulse triggers flip flop 102 which, in turn and in less than the period of one input signal pulse, triggers flip flop 206. This stops counter 202 and begins counter 204 so that while counter 202 reflects the count at the measured edge, counter 204 continues to count subsequent pulses. Logic circuit 20 stores the count at each stopped counter for use in a later measurement.

The ECL components 202, 204 and 206 permit a transition that is fast enough so that counter 202 or 204 counts the next pulse following the last pulse counted by the other counter 202 or 204. The counter arrangement illustrated in FIG. 6 can accurately count pulses on an input signal up to a frequency of approximately 1.5 GHz.

The total event count (i.e. the event read) corresponding to the measured edge is equal to the count on the stopped counter 202 or 204, plus the count from the other counter 202 or 204 when it was last stopped, plus the count of FPGA counter 212 at the time flip flops 102 and 206 trigger. The Q output of flip flop 206 is received by logic circuit 20, which is configured to sum these numbers at each transition of the flip flop 206's Q output. The resulting sum is the event portion of the measurement tag described above.

In a preferred embodiment, an event counter as shown in FIG. 6 is provided for each of the start and stop measurement circuits in each of channels 12 and 14. Similarly, the logic circuit may embody a separate continuous time counter for each measurement circuit.

The Input Signal Multiplexers

Figure 7:
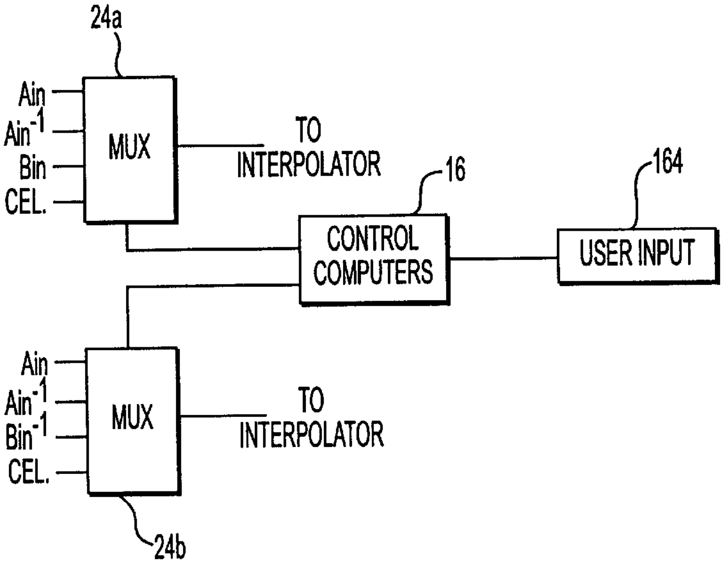
FIG. 7 is a block diagram illustration of a time interval analyzer in accordance with a preferred embodiment of the present invention.

Referring to FIGS. 1 and 7, control computer 16 controls multiplexers 24*a* and 24*b* to gate any of four inputs to their respective interpolators. The four selectable inputs to multiplexer 24*a* are the channel 12 input signal $A_{in}$, the input signal inverse $A_{in}^{-1}$, the input signal $B_{in}$ to channel 14 and a calibration signal. The inputs to multiplexer 24*b* are $A_{in}$, the inverse $A_{in}^{-1}$ the inverse $B_{in}^{-1}$ and the calibration signal.

The Arming Circuit

Figure 8:
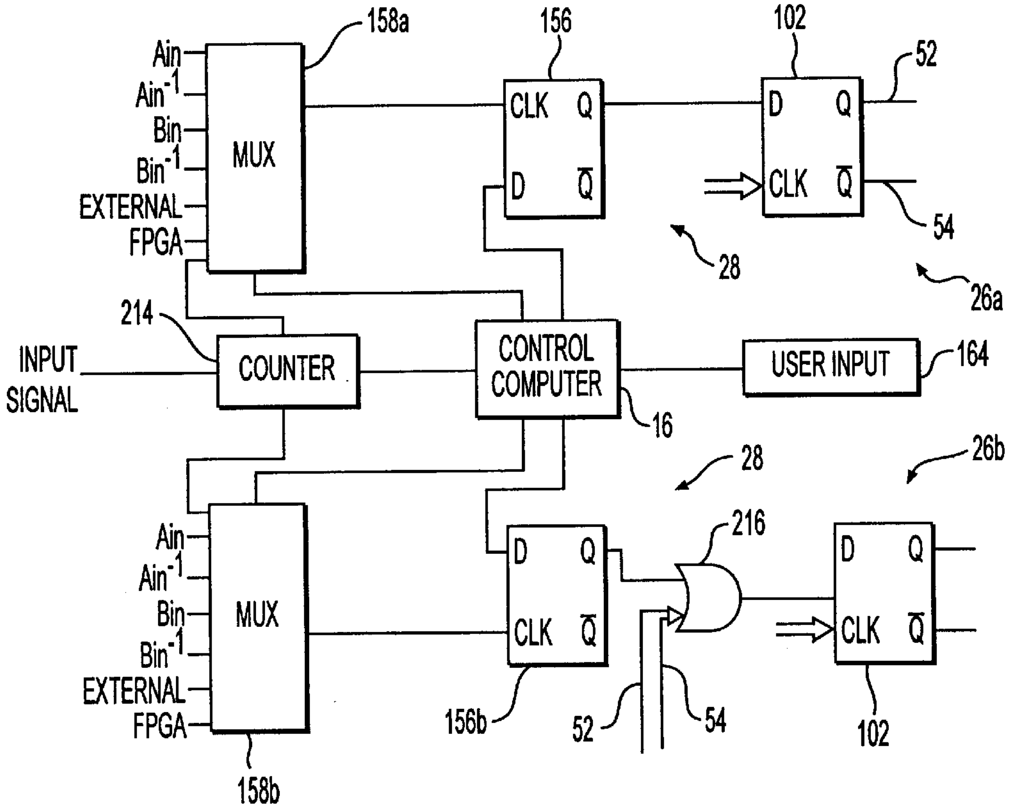
FIG. 8 is a block diagram illustration of a time interval analyzer in accordance with a preferred embodiment of the present invention.

Referring now to FIG. 8, arming circuit 28 includes a pair of flip flops 156*a* and 156*b* that respectively arm interpolators 26*a* and 26*b*. The D input for each flip flop is an output from control computer 16 that is directed to the flip flop through a TTL-to-ECL converter (not shown). The Q output of each flip flop feeds to the D input of first stage flip flops 102 (see also FIG. 4) in interpolators 26*a* and 26*b*. Thus, once computer 16 arms flip flop 156*a* or 156*b* with a high signal at its D input, the next rising edge received at the flip flop's clock input gates the high signal to the flip flop's Q output to thereafter enable the interpolator flip flop 102. This begins the interpolator measurement. That is, once the computer enables the arming circuit flip flop, the flip flop clock input arms the measurement circuit to begin the measurement.

Figure 9:
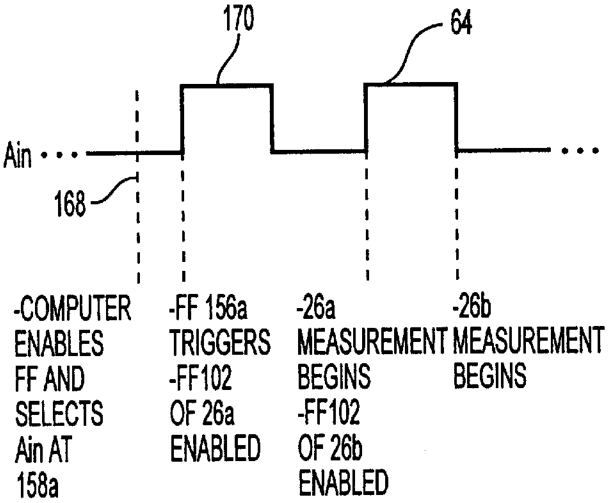
FIG. 9 is a graphical illustration of the operation of a time interval analyzer in accordance with a preferred embodiment of the present invention.

The clock inputs are provided by respective multiplexers 158*a* and 158*b*, allowing the user in the embodiment illustrated in FIG. 8 to select one of six possible inputs from which to arm each measurement circuit. The selection of the arming signal at multiplexers 158*a* and 158*b*, and the selection of the measurement circuit input signal at multiplexers 24*a* and 24*b* (FIGS. 1 and 7), determine the measurement performed at channel 12 (FIG. 1). Referring also to FIG. 9, for example, assume that the user selects, through user input switch 164 and computer 16, the time interval analyzer's channel 12 input signal $A_{in}$ at multiplexers 24*a* and 158*a* and that computer 16 has enabled flip flop 156*a* at 168. The rising edge of the next input signal pulse 170 triggers flip flop 156*a*, thereby enabling flip flop 102. Since $A_{in}$ is also selected at multiplexer 24*a*, the $A_{in}$ signal is directed to the clock input of flip flop 102. Due to the propagation delay through multiplexer 158*a* and flip flop 156*a*, however, flip flop 102 triggers at the rising edge of the next input signal pulse, 64. This edge is, therefore, the measured edge as described above.

Had $A_{in}^{-1}$ been selected at multiplexer 24*a*, the start measure circuit would have measured the falling edge of pulse 170.

A user might select $B_{in}$ at multiplexer 158*a* and $A_{in}$ at multiplexer 24*a* to measure the $A_{in}$ signal based on an event in the $B_{in}$ signal. For example, if $A_{in}$ describes events that occur during a shaft's rotation, and if $B_{in}$ is a signal corresponding to the count of shaft rotations, this arrangement could be used to measure an $A_{in}$ event at each shaft rotation. Furthermore, the user may arm a measurement by an external signal directed to the time interval analyzer through an appropriate port.

The logic circuit may also be used to provide an arming signal through the "FPGA" input to the multiplexers. This input can be used to provide a variety of pre-programmed and/or adjustable arming signals. For example, the FPGA is driven by the time base clock and in a preferred embodiment is programmed to divide down the clock by a factor N selected by the user through switch 164 and computer 16 to produce a signal at the FPGA input to the multiplexers that has a pulse at every Nth time base clock pulse. Thus, the signal selected at multiplexer 24*a* is measured every N time base clock pulses.

Furthermore, a divide-by-N counter 214 is driven by the output signal from start measurement circuit multiplexer 24*a*. Thus, the start and/or stop measure circuits can be armed by the start measurement circuit's input signal, divided by a desired factor. For example, assuming that counter 214 is an eight-bit counter and that it is desired to measure the start measurement circuit's input signal at every 100th pulse, computer 16 initially loads counter 214 to 156. When the counter reaches 255, the next count rolls the counter back to 156 and outputs a pulse to multiplexer 158*a*. A divide-by-N counter may be provided for each of the start and stop measurement circuits.

The time interval analyzer may be configured to measure subsequent pulse edges, whether for pulse width, single period or other desired measurement, by deactivating the D input to flip flop 156*b* and enabling the stop measurement trigger circuit with an output from the start measurement trigger circuit. For example, to measure pulse width, computer 16 selects the $A_{in}$ input at multiplexers 158*a* and 24*a* and deactivates flip flop 156*b*. Referring again to FIG. 9, upon enabling flip flop 156*a*, but not flip flop 156*b*, at 168, flip flop 102 of the start measurement circuit interpolator 26*a* is enabled at the rising edge of pulse 170. Thus, the interpolator measures the rising edge of the next pulse 64. At pulse 64's rising edge, the $Q/Q^{-1}$ output of flip flop 102 in the start measurement interpolator changes state, and this output is directed to the input of an OR gate 216. This causes the OR gate output to go high, thereby enabling flip flop 102 of stop measurement interpolator 26*b*. Since the computer has selected the $A_{in}^{-1}$ input to the stop measurement multiplexer 24*b*, the stop measurement interpolator's flip flop 102 changes state at the next falling edge it receives, which in this case is the falling edge of pulse 64. As described above, the logic circuit outputs, through FIFO memory 18, a measurement tag to the computer that corresponds to each measured edge. The difference in the time portions of these tags is equal to the time interval over the width of pulse 64. Computer 16 determines this difference and outputs an appropriate signal to the display device to notify the user.

Accordingly, the time interval analyzer can measure the time interval between events on an input signal by comparing the time portion of the measurement tags of these events as measured by the start and stop measurement circuits. Additional measurement circuits, similar to and in parallel with the start and stop measurement circuits, can be added to enable time interval measurements among several signal events within a relatively short period of time. The selection of a given measurement is determined by the selections of the input signals and arming signals to each measurement circuit, and it should be understood that the measurement circuits and the arming circuits can be configured in any suitable arrangement with any suitable input signal(s) to achieve a desired time interval measurement. Thus, it should be understood that such configurations and combinations fall within the scope and spirit of the present invention.

For instance, assume that it is desired to measure the time interval between the rising edges of first and fifth pulses on an input signal $A_{in}$. Control computer 16 may select $A_{in}$ at multiplexers 24*a* and 158*a*. At the same time, the computer loads counter 214 to 251 and selects the counter output as the input to multiplexer 158*b*. Thus, the stop measurement circuit arms five pulses after the start measurement circuit and, therefore, measures the rising edge of the fifth pulse following the start measurement circuit's measured pulse.

Figure 11:
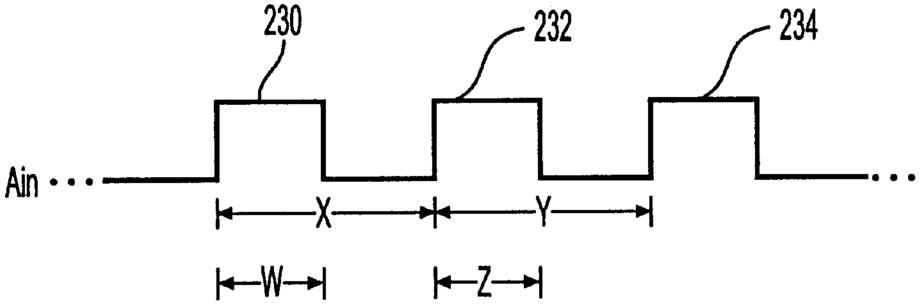
FIG. 11 is a graphical illustration of the operation of a time interval analyzer in accordance with a preferred embodiment of the present invention.

Furthermore, a time interval analyzer according to the present invention may be used to measure jitter in an input signal. Referring to FIG. 11, cycle-to-cycle jitter may be measured by comparing the periods of subsequent signal cycles, for example the period indicated at X to the period indicated at Y. Referring also the FIG. 1, this measurement may be effected by selecting the $A_{in}$ input to multiplexers 24*a* and 24*b*, selecting the $A_{in}$ input the multiplexer 158*a* (FIG. 8) and deactivating multiplexer 156*b* (FIG. 8). Channel 14 has the same configuration and is armed to measure the period immediately following the period measured by channel 12. Thus, control computer 16, which may be embodied by the same computer for both channels 12 and 14, measures the periods of cycles X and Y.

More specifically, the output of flip flop 102 on lines 52 and 54 (FIG. 4) is directed to the arming circuit multiplexer 158*a* (FIG. 8) for the start measurement circuit of channel 14 so that the signal arms channel 14's start measurement circuit. Thus, the channel 14 start measurement circuit measures the first rising edge following the rising edge of pulse 230, i.e. the rising edge of pulse 232. The channel 14 stop measurement circuit is armed as described above to measure the falling edge of pulse 232 to define the pulse width. The comparison of the pulse width measurements made by channels 12 and 14 indicates jitter present on signal $A_{in}$.

To measure duty cycle, channel 12 is configured to measure period X, and channel 14 is configured to measure pulse width W. The signal's duty cycle, therefore, is equal to W/X. In an alternate configuration, channel 12 includes three parallel measurement circuits so that the single channel can measure three subsequent edges (the rising and falling edges of pulse 230 and the rising edge of pulse 232) to thereby measure duty cycle. To measure pulse-width-to-pulse-width jitter, channel 12 measures the pulse width of pulse 230, and channel 14 measures the width of pulse 232. Comparison of these measurements indicates jitter from one pulse to another. It should be understood that various measurements may be made to detect jitter error.

To measure the slope of a rising signal edge, the $A_{in}$ input is selected at each of the multiplexers 24*a* and 24*b*, and VRef2 is offset from VRef1 so that the start measurement circuit measures the time at which a rising edge of a pulse on the input signal reaches a first voltage level and so that the stop measurement circuit measures the time at which the edge reaches a second, higher, level. The voltage level difference divided by the time difference is the edge slope.

Computer 16 may store predetermined measurement configurations such as pulse width, single period width and duty cycle, that may be selected by the user through switch 164. Switch 164 may comprise any suitable mechanism such as a button or a software option. For example, predefined measurement options may be presented to the user as selectable icons on the display device.

Real Time Measurements

Figure 10:
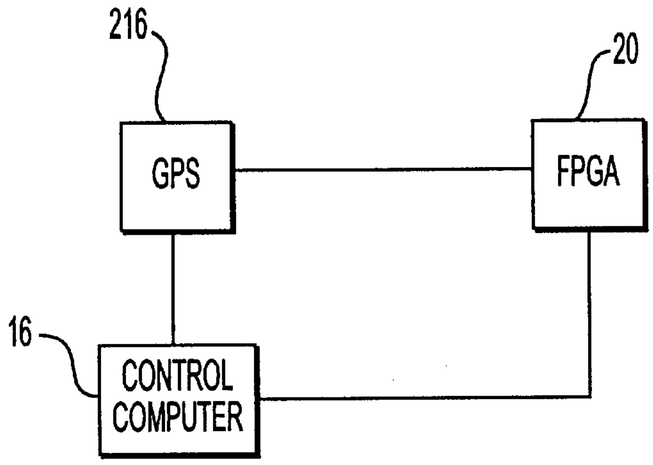
FIG. 10 is a block-diagram illustration of a time interval analyzer in accordance with a preferred embodiment of the present invention in association with a global positioning system.

The time interval analyzer may be calibrated so that the time portion of the measurement tag to a measured event corresponds to real time. Referring to FIG. 10, the time interval analyzer includes two inputs received from a global positioning system (GPS) 216 and directed to logic circuit 20 and computer 16, respectively. The construction and operation of global positioning systems does not, in and of itself, form a part of the present invention and is therefore not discussed herein. As should be understood, however, GPS systems typically output both a 1 Hz binary signal and a serial signal that identifies the time at the rising edges of pulses in the binary signal. The time interval analyzer inputs are configured so that the serial input is directed to computer 16 and the 1 Hz signal is directed to logic circuit 20.

Computer 16 reads the exact time from the serial input and thereby knows the time at the next pulse on the 1 Hz signal. Thus, before the next pulse arrives, computer 16 instructs logic circuit 20 to load continuous time counter 30 (FIG. 1) to a predetermined count, for example a count equal to the number of pulses of a 50 MHz signal beginning at Jan. 1, 1970 and ending at the next GPS pulse. The computer also instructs logic circuit 20 to start the continuous time counter at the arrival of the GPS pulse. Thus, the continuous time counter is calibrated to real time.

There is, generally, some error in the real time calibration. For example, GPS pulses typically exhibit an approximately 20 ns jitter. Furthermore, the time counter is driven by the time base clock. Since the occurrence of the time base pulse may not exactly coincide with the GPS pulse, an error up to one period of the time base clock may also be introduced. Such error, however, is acceptable for real time measurement of signal events.

Furthermore, it should be understood that the real time calibration can be configured to account for delays in the measurement circuitry. For example, the three-pulse delay in assigning the time portion of the measurement tag described above may be accommodated by delaying the start of the continuous time counter until three time base clock pulses following receipt of the GPS pulse or by programming the logic circuit or computer to account for the difference.

While one or more preferred embodiments of the invention have been described above, it should be understood that any and all equivalent realizations of the presented invention are included within the scope and spirit thereof. The embodiments depicted are present by way of example only and are not intended as limitations on the present invention. Thus, it should be understood by those of ordinary skill in the art that the present invention is not limited to these embodiments since modifications can be made. Therefore, it is contemplated that any and all such embodiments are included in the present invention as may fall within the literal or equivalent scope of the appended claims.

What is claimed is:

1. A time interval analyzer for measuring time intervals between signal events, said analyzer comprising:

a signal channel that receives an input signal;

a plurality of measurement circuits defined within said signal channel in parallel with each other, each said measurement circuit being configured to receive said input signal, measure an occurrence of a first event of said input signal with respect to a predetermined time reference and output a time signal corresponding to the measurement of said occurrence; and a processor circuit in communication with said signal channel, wherein said processor circuit is configured to receive and compare said time signals from said measurement circuits to each other to determine a time interval between said first event measured by a first said measurement circuit and an event measured by a second said measurement circuit.

2. The analyzer as in claim 1, wherein each said measurement circuit includes a comparator that receives said input signal and a reference signal, compares said input signal to said reference signal and outputs a binary signal responsively to said comparison.

3. The analyzer as in claim 2, wherein each said measurement circuit includes a multiplexer downstream from said comparator, wherein said multiplexer receives said binary signal and at least one other input signal and wherein said processor circuit controls said multiplexer so that said multiplexer gates one of said binary signal and said at least one other signal to an output of said multiplexer.

4. The analyzer as in claim 3, wherein one of said at least one other signals is an inverse of said binary signal.

5. The analyzer as in claim 1, wherein each said measurement circuit includes an interpolator circuit, wherein said interpolator circuit is configured to measure a time period between said first event and a reference event of a time base signal and to output said time signal corresponding to said time period.

6. The analyzer as in claim 5, wherein said interpolator changes a voltage across a capacitor during said time period so that said voltage change corresponds to said time period and wherein said time signal is based on the voltage level across said capacitor following said time period.

7. The analyzer as in claim 1, including a plurality of said signal channels.

8. A time interval analyzer for measuring time intervals between signal events, said analyzer comprising:

a signal channel that receives an input signal;

a plurality of measurement circuits defined within said signal channel in parallel with each other, each said measurement circuit including a comparator that receives said input signal and a reference signal, compares said input signal to said reference signal and outputs a binary signal responsively to said comparison, and an interpolator circuit, wherein said interpolator circuit is configured to measure a time period between a first event in said binary signal and a reference event of a time base signal and to output a time signal corresponding to said time period; and a processor circuit in communication with said signal channel, wherein said processor circuit is configured to receive and compare said time signals from said measurement circuits to each other to determine a time interval between said first event measured by a first said measurement circuit and an event measured by a second said measurement circuit.

9. The analyzer as in claim 8, including a plurality of said signal channels.

10. The analyzer as in claim 8, wherein each said interpolator includes a trigger circuit that receives said binary signal and that outputs a trigger signal at a triggering level upon occurrence of said first event and at a non-triggering level upon occurrence of a reference event that follows said first event, a first current circuit having a current source or a current sink, a second current circuit having a current sink where said first current circuit has a current source, or a current source where said first current circuit has a current sink, a capacitor, a shunt, wherein said shunt and said capacitor are operatively disposed in parallel with respect to said first current circuit, wherein said shunt is disposed between said first current circuit and said second current circuit, and wherein said shunt receives said trigger signal and is selectable between conducting and non-conducting states between said first current circuit and said second current circuit depending upon said trigger signal so that said shunt is driven to said conducting state from said non-conducting state upon receiving said trigger signal at said triggering level and said shunt is driven to said non-conducting state from said conducting state upon receiving said trigger signal at said non-triggering level.

11. A time interval analyzer for measuring time intervals between signal events, said analyzer comprising:

a signal channel that receives an input signal;

a plurality of measurement circuits defined within said signal channel in parallel with each other, each said measurement circuit including a comparator that receives said input signal and a reference signal, compares said input signal to said reference signal and outputs a binary signal responsively to said comparison, a multiplexer downstream from said comparator that receives said binary signal and at least one other signal so that said multiplexer gates one of said binary signal and said at least one other signal to an output of said multiplexer, and an interpolator circuit that receives said multiplexer output, wherein said interpolator circuit is configured to measure a time period between a first event of said multiplexer output and a reference event of a time base signal and to output a time signal corresponding to said time period; and a processor circuit in communication with said signal channel, wherein said processor circuit is configured to receive and compare said time signals from said measurement circuits to each other to determine a time interval between said first event measured by a first said measurement circuit and said first event measured by a second said measurement circuit.

12. The analyzer as in claim 11, wherein each said interpolator includes a trigger circuit that receives said binary signal and that outputs an event trigger signal at a triggering level upon occurrence of said first event and at a non-triggering level upon occurrence of said reference event, a first current circuit having a current source or a current sink, a second current circuit having a current sink where said first current circuit has a current source, or a current source where said first current circuit has a current sink, a capacitor, a shunt, wherein said shunt and said capacitor are operatively disposed in parallel with respect to said first current circuit, wherein said shunt is disposed between said first current circuit and said second current circuit, and wherein said shunt receives said event trigger signal and is selectable between conducting and non-conducting states between said first current circuit and said second current circuit depending upon said event trigger signal so that said shunt is driven to said conducting state from said non-conducting state upon receiving said event trigger signal at said triggering level and said shunt is driven to said non-conducting state from said conducting state upon receiving said event trigger signal at said non-triggering level.

13. The analyzer as in claim 12, wherein said first current circuit has a constant current source and said second current circuit has a current sink.

14. The analyzer as in claim 12, wherein said first current circuit has a constant current sink and said second current circuit has a current source.

15. The analyzer as in claim 12, wherein each said measurement circuit includes a current boost circuit in communication with said capacitor, said current boost circuit configured to apply a voltage transition between said first current circuit and said capacitor upon occurrence of said reference event so that said capacitor voltage changes with said voltage transition.

16. The analyzer as in claim 12, including a time counter that receives said time base signal and that increments a time count at each period of said time base signal, wherein said trigger circuit outputs a time trigger signal at a triggering level upon occurrence of said first event, wherein said processor circuit is in communication with said trigger circuit and said time counter so that said processor circuit receives said time trigger signal and reads said time count from said time counter, and wherein said processor circuit is configured to read said time count upon receiving said time trigger signal at said first triggering level so that said time count read by said processor circuit indicates the time at which said first input signal event occurred.

17. The analyzer as in claim 16, including an event counter that receives said output signal from said multiplexer and that increments an event count at each occurrence of a said event thereof, wherein said processor circuit is configured to read said event count upon receiving said time trigger signal at said first triggering level so that said event count read by said processor circuit indicates the position of said first event within a sequence of said events.

18. The analyzer as in claim 17, wherein said event counter includes a first counter that receives said output signal from said multiplexer and that, when said first counter is activated, increments a first count at each occurrence of a said event of said output signal, a second counter that receives said output signal from said multiplexer and that, when said second counter is activated, increments a second count at each said occurrence of a said event of said output signal, and a control circuit that receives said event trigger signal from said trigger circuit and that outputs a control signal to each of said first counter and said second counter that controls activation of said first counter and said second counter so that only one of said first counter and said second counter is activated at a time, wherein said control circuit is configured so that, when said event trigger signal goes to said triggering level from a non-triggering level and when one of said first counter and said second counter is activated and the other of said first counter and said second counter is deactivated, said control circuit deactivates said one of said first counter and said second counter and activates said other of said first counter and said second counter.

19. The analyzer as in claim 13, wherein each said measurement circuit includes a current boost circuit in communication with said capacitor, said current boost circuit configured to apply a voltage transition between said first current circuit and said capacitor upon occurrence of said reference event so that said capacitor voltage changes with said voltage transition, wherein said analyzer includes a time counter that receives said time base signal and that increments a time count at each period of said time base signal, wherein said trigger circuit outputs a time trigger signal at a triggering level upon occurrence of said first event, wherein said processor circuit is in communication with said trigger circuit and said time counter so that said processor circuit receives said time trigger signal and reads said time count from said time counter, wherein said processor circuit is configured to read said time count upon receiving said time trigger signal at said first triggering level so that said time count read by said processor circuit indicates the time at which said first input signal event occurred, wherein said analyzer includes an event counter that receives said output signal from said multiplexer and that increments an event count at each occurrence of a said event thereof, and wherein said processor circuit is configured to read said event count upon receiving said time trigger signal at said first triggering level so that said event count read by said processor circuit indicates the position of said first event within a sequence of said events.

20. A time interval analyzer for measuring time intervals between signal events, said analyzer comprising:

a signal channel that receives an input signal;

a plurality of measurement circuits defined within said signal channel in parallel with each other, each said measurement circuit including a multiplexer that receives said input signal and at least one other signal so that said multiplexer gates one of said input signal and said at least one other signal to an output of said multiplexer, and an interpolator circuit that receives said multiplexer output, wherein said interpolator circuit is configured to measure a time period between a first event of said multiplexer output and a reference event and to output a time signal corresponding to said time period; and a processor circuit in communication with said signal channel, wherein said processor circuit is configured to receive and compare said time signals from said measurement circuits to each other to determine a time interval between said first event measured by a first said measurement circuit and said first event measured by a second said measurement circuit.

* * * * *